(12) United States Patent
Ishizaki et al.

(10) Patent No.: US 6,201,724 B1
(45) Date of Patent: Mar. 13, 2001

(54) SEMICONDUCTOR MEMORY HAVING IMPROVED REGISTER ARRAY ACCESS SPEED

(75) Inventors: Tatsuya Ishizaki; Misao Suzuki; Souichirou Yoshida, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/437,010

(22) Filed: Nov. 9, 1999

(30) Foreign Application Priority Data

Nov. 12, 1998 (JP) .................................................. 10-321655

(51) Int. Cl.⁷ .................................................. G11C 15/00
(52) U.S. Cl. .............................. 365/49; 365/63; 365/149; 365/230.03
(58) Field of Search .................... 365/49, 63, 230.03, 365/230.01, 149

(56) References Cited

U.S. PATENT DOCUMENTS 5,226,009 * 7/1993 Arimoto .......................... 365/189.04
5,596,521 * 1/1997 Tanaka et al. ........................ 365/49
5,680,363 * 10/1997 Dosaka et al. ................... 365/230.03

* cited by examiner

Primary Examiner—David Nelms
Assistant Examiner—Hoal V. Ho
(74) Attorney, Agent, or Firm—Darryl G. Walker

(57) ABSTRACT

A semiconductor memory (100) is disclosed that includes a memory cell array (102) coupled to a register array section (104) that can function as a cache. Access times for misses to the register array section (104) during a continuous read operation can be reduced. A memory cell array (102) is coupled to the register array section (104) by a first transfer bus (TBT1-1 to TBN1-$i$). First transfer bus (TBT1-1 to TBN1-$i$) is connected to a local read/write bus (LRWBT and LRWBN) by transistors (106-1 to 108-$i$) and to register arrays (116-1 to 116-($i+j$)) by first switches (118-1 to 118-($i+j$)). In a continuous read operation, during a register array section miss, transistors (106-1 to 108-$i$) are turned on and the first switches (118-1 to 118-($i+j$)) are turned on.

20 Claims, 3 Drawing Sheets

SEMICONDUCTOR MEMORY HAVING IMPROVED REGISTER ARRAY ACCESS SPEED

TECHNICAL FIELD

The present invention relates generally to a semiconductor memory, and more particularly to a semiconductor memory having a register array that can function as a cache.

BACKGROUND OF THE INVENTION

FIG. 3 sets forth a conventional semiconductor memory. The semiconductor memory arrangement of FIG. 3 can be referred to as a virtual channel memory. The virtual channel memory is designated by the general reference character 300 and can include a number of dynamic random access memory (DRAM) cells arranged into a memory cell array 302. Memory cell array 302 can include DRAM cells arranged in row and column directions.

The virtual channel memory 300 can also include a register array section 304. A register array section 304 can include a number of registers arranged in row and column directions. The number of rows and/or columns can be a predetermined ratio of the number of rows and columns in the memory cell array 302. A register array section 304 can have a "cache" function.

One skilled in the art would recognize that a cache can store a portion of the data stored in a memory cell array. Access to the cache can be faster than access to the memory cell array. Data read operations can access a cache. If the data is stored within, there is a cache "hit" and the data can be accessed from a register array section 304. If the data is not stored within the cache there is a cache "miss."

The memory cell array 302 and register array section 304 can be connected to each other by transfer buses TBT1-1 to TBN1-i. Additional transfer buses TBT2-1 to TBN2-i can be connected to the register array section 304. A read/write bus RWBT and RWBN can be connected to transfer buses TBT1-1 to TBN1-i and TBT2-1 to TBN2-i.

Data values of the conventional virtual RAM of FIG. 3 can be read in a number of different ways. One type of read operation is a "continuous" read operation. One skilled in the art would recognize that a continuous read operation can be a series of read operations that occur one after another. As just one example, a continuous read operation may include a number of read operations that access the same row address, but different column addresses. A continuous read operation can include a "miss" to the register array section 304. In a conventional continuous read operation that results in a register array miss, read data from memory cell array 302 is temporarily transferred to register array section 304 by way of transfer buses TBT1-1 to TBN1-i. The data may then be read from the register array section 304 by way of transfer buses TBT2-1 to TBN2-i.

In another type of read operation, data may be read directly from the memory cell array 302, and not through register array section 304. In such a read operation, data may be read by way of transfer buses TBT1-1 to TBN1-i to local read/write bus LRWBT and LRWBN.

Data values may also be written to the virtual channel memory 300 in different ways. Data within register array section 304 may be written into memory cell array 302 by way of transfer buses TBT1-1 to TBN1-i. Data may also be written to memory cell array 302 without using register array section 304. Data on a local read/write bus LRWBT and LRWBN may be written into memory cell array 302 by way of transfer buses TBT1-1 to TBN1-i.

The above-described approach to a virtual channel memory can have drawbacks. In the case of a continuous read operation, resulting from a register miss, data read from memory cell array 302 is temporarily transferred to register array section 304, and then read afterward from the register array section 304. As a result, continuous read operations may take considerable time.

SUMMARY OF THE INVENTION

It is an object of present invention to provide a semiconductor memory, having a register array section with a cache function, that provides a reduced access time when a read operation results in a miss to the register array section.

According to the various embodiments, a semiconductor memory can include a memory cell array having a number of memory cells arranged in row and column directions and a register array section having a number of registers arrays arranged in row and column directions. The numbers of register arrays may be a predetermined ratio of the number of rows and columns of memory cells. The semiconductor memory may further include a number of first switches, second switches, and third switches. The first switches can be situated between the register arrays and a transfer bus that is connected to the memory cell array. The second switches can be situated between the register arrays and a read/write bus. The third switches can be situated between the second switches and the read/write bus. A local read/write bus can be connected to the read/write bus, and a bus connector, activated by a read/write signal, can connect the transfer bus to the local read/write bus.

According to another aspect of the embodiments, a semiconductor memory can include a memory cell array having a number of memory cells arranged in row and column directions and a register array section having a number of registers arrays arranged in row and column directions. The numbers of register arrays may be a predetermined ratio of the number of rows and columns of memory cells. The semiconductor memory may further include a number of first switches, second switches, and third switches. The first switches can be situated between the register arrays and a transfer bus that is connected to the memory cell array. The second switches can be situated between the register arrays and a read/write bus. The third switches can have one end connected to the read/write bus and another end commonly connected to the second switches of the same register array column. A local read/write bus can be connected to the read/write bus, and a bus connector, activated by a read/write signal, can connect the transfer bus to the local read/write bus.

In the various embodiments, if a bus connector within a virtual channel memory is activated, data in a memory cell array can be transferred to a read/write bus, not through a register array section, but through a local read/write bus. At the same time, if first and second switches are turned on, data in the memory cell array can be transferred to the register array section. In this way, in a continuous read, a virtual channel memory can selectively provide a path for reading data to the read/write bus, through a bus connector, and also to the register array section. Consequently, first accesses on register array section misses can be shortened.

According to another aspect of the embodiments, a semiconductor memory can include a memory cell array having a number of memory cells arranged into row and column directions and a register array section having a number of registers arranged into rows and columns. A first transfer bus may transfer read and write data between the memory cell array and the register array section. A second transfer bus may transfer read and write data between the register array section and a read/write bus. A local read/write bus may transfer read and write data between the first transfer bus and the read/write bus. The semiconductor memory may further include a control circuit. in a continuous read operation, the control circuit can transfer first read data from the memory cell array to the read/write bus through the first transfer bus and the local read/write bus. The control circuit may also transfer second read data from the memory cell array to the register array section through the first transfer bus.

In the above-described arrangement, when data is read from the memory cell array in a continuous read operation, the control circuit can transfer the first read data from the memory cell array to the read/write bus via the first transfer bus and local read/write bus, and at the same time, second read data from the memory cell array can be transferred to the register array section via the first transfer bus. Thus, in a continuous read operation, a data path to the read/write bus can be formed through a connecting circuit and through the register array section. First accesses in a continuous read operation that result in misses to the register array section can be shortened.

DETAILED DESCRIPTION OF THE EMBODIMENTS

Various embodiments of the present invention will now be described in conjunction with a number of figures.

Figure 1:
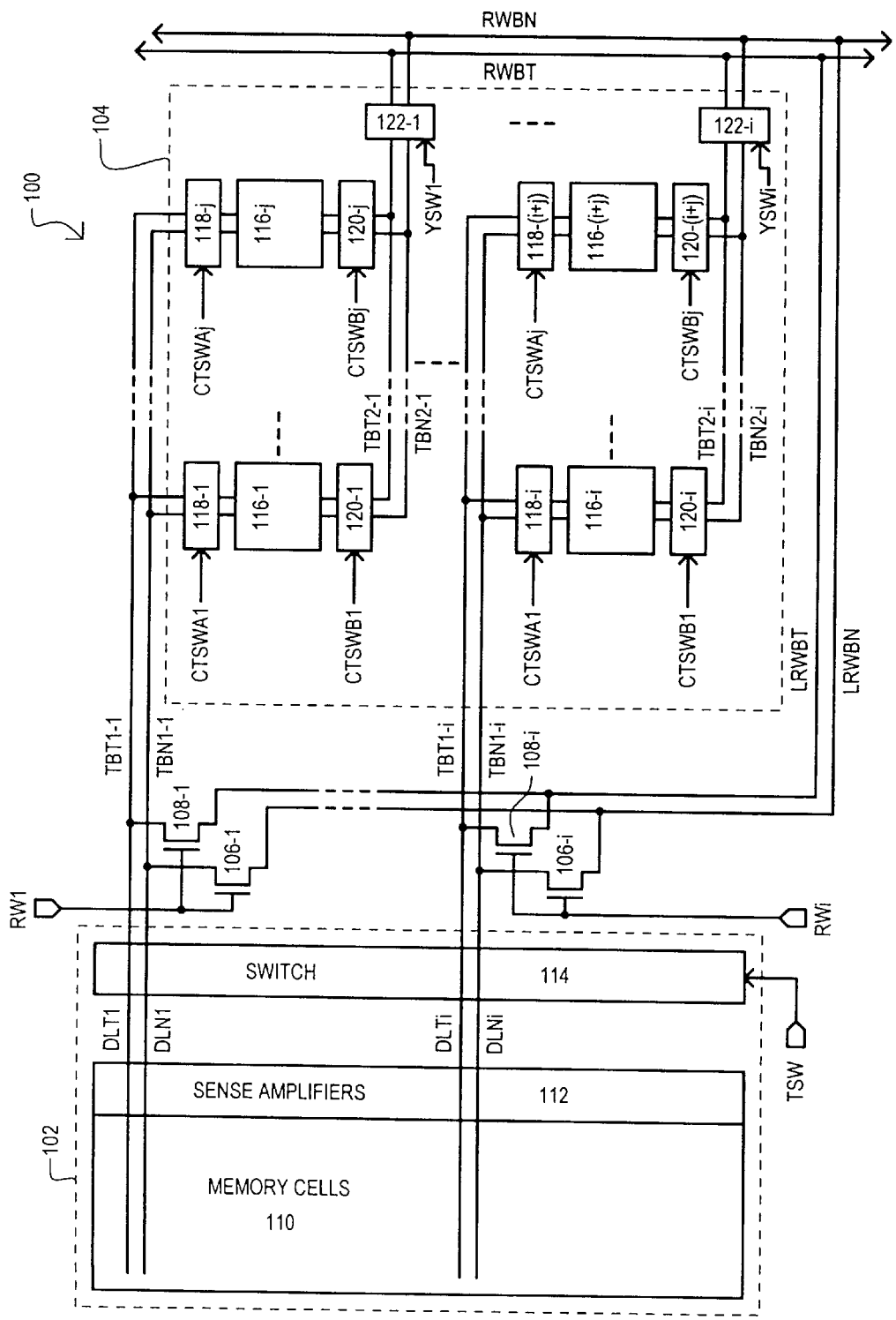
FIG. 1 shows a semiconductor memory according to a first embodiment.

A first embodiment of the present invention is shown in FIG. 1. The first embodiment is a semiconductor memory designated by the general reference character 100. The first embodiment 100 is shown to include a memory cell array 102 and a register array section 104. A memory cell array 102 can include a number of dynamic random access memory (DRAM) cells arranged into one or more arrays in row and column directions.

A register array section 104 can include a number of registers arranged into rows and columns. The number of rows and columns of registers can be a predetermined ratio of the number of rows and columns of DRAM cells in memory cell array 102. In one particular embodiment, a register array section 104 can include a number of static random access memory (SRAM) cells. A register array section 104 may have a cache function.

As shown in FIG. 1, first transfer buses TBT1-1 to TBN1-i can be situated between memory cell array 102 and register array section 104. The first embodiment 100 can further include transistors 106-1/108-1 to 106-i/108-i. Transistors 106-1 to 106-i can connect first transfer bus lines TBT1-1 to TBT1-i to a local read/write bus line LWRBT. Transistors 108-1 to 108-i can connect first transfer bus lines TBN1-1 to TBN1-i to a local read/write bus line LWRBN. Transistors 106-1/108-1 are shown to receive a read/write signal RW1. Transistors 106-i/108-i are shown to receive a read/write signal RWi. Transistors 106-1/108-1 to 106-i/108-i may include field effect transistors (FET).

In one embodiment, the memory cell array 102 can include memory cells 110, sense amplifiers 112, and switches 114. Memory cells can store data and be connected to bit lines within memory cell array 102. Sense amplifiers 112 can amplify data signals on the bit lines. Array switches 114 can connect memory cell data to digit lines DLT1 to DLNi. Digit lines DLT1 to DLNi can be connected to first transfer buses TBT1-1 to TBN1-i.

In one embodiment, the register array section 104 can include a number of register arrays 116-1 to 116-(i+j), first switches 118-1 to 118-(i+j), second switches 120-1 to 120-(i+j), and third switches 122-1 to 122-i. One skilled in the art would recognize that register arrays 116-1 to 116-(i+j) can each include one or more registers that store data transferred from memory cell array 102 or received on a read/write bus. The register arrays 116-1 to 116-(i+j) of FIG. 1 can be conceptualized as being arranged into rows and columns. In the particular example of FIG. 1, one such column can include register arrays 116-1 and 116-j, while another column can include register arrays 116-i and 116-(i+j). One such row can include register arrays 116-1 and 116-i, while another can include register arrays 116-j and 116-(i+j). Thus, in the example of FIG. 1, there are "i" columns and "j" rows of register arrays (116-i and 116-(i+j)).

As shown in FIG. 1, a register array section 104 may further include second transfer buses TBT2-1 to TBN2-i. In the particular example of FIG. 1, a transfer bus line pair TBT2-1/TBN2-1 to TBT2-i/TBN2-i can correspond to each column of register arrays (116-1 to 116-j and 116-i to 116-(i+j)).

First switches 118-1 to 118-(i+j) can be provided between first transfer buses TBT1-1 to TBN1-i and register arrays 116-1 to 116-(i+j). In the arrangement of FIG. 1, first switches (118-1 to 118-(i+j)) of the same register array column can receive first channel selection signals CTSWA1 to CTSWAj.

Second switches 120-1 to 120-(i+j) can be provided between second transfer buses TBT2-1 to TBN2-i and register arrays 116-1 to 116-(i+j). In the arrangement of FIG. 1, second switches (120-1 to 120-(i+j)) of the same register array column can receive second channel selection signals CTSWB1 to CTSWBj.

Third switches 122-1 to 122-i can be provided between second transfer buses TBT2-1 to TBN2-i and read/write bus RWBT and RWBN. In the arrangement of FIG. 1, third switches 122-1 to 122-i can receive transfer signals YSW-1 to YSW-i, respectively.

In the semiconductor memory 100 described above, if read/write signal RWi is active, transistors 106-i and 108-i can be turned on. Digit lines DLTi and DLNi can be connected to local bus lines LRWBT and LRWBN, respectively. At this moment, if a read operation is conducted, data read from memory cells 110 to first transfer buses TBT1-i to TBN1-i can be placed on local bus LRWBT and LRWBN by way of transistors 106-i and 108-i. The data on local bus LRWBT and LRWBN can then placed on read/write bus RWBT and RWBN. If a write operation is conducted, data to be written can be driven on read/write bus RWBT and RWBN. The data on read/write bus RWBT and RWBN can be placed on local bus LRWBT and LRWBN. With transistors 106-i and 108-i turned on, data on local bus LRWBT and LRWBN can be placed on first transfer bus lines TBT1-i and TBN1-i and digit lines DLTi and DLNi.

Further, if read/write signal RWi is active and first channel selection signal CTSWAj is active, first switches 118-j through 118-(i+j) can be turned on and first transfer buses TBT1-1 to TBN1-i can be connected to the register arrays (116-j to 116(i+j)) of the jth row. As a result, data stored in memory cells 110 can be transferred (read) into the jth row of register arrays (116-j to 116(i+j)). Conversely, data stored in the jth row of register arrays (116-j to 116(i+j)) can be transferred (written) into memory cells 110.

Still further, if second channel selection signal CTSWBj is active, second switches 120-j through 120-(i+j) can be turned on and second transfer buses TBT2-1 and TBN2-i can be connected to the register arrays (116-j to 116(i+j)) of the jth row. If transfer signals YSW1 is active, third switch 122-1 can be turned on. Data can then be read from the register arrays 116-j of the jth row onto read/write bus RWBT and RWBN and local read/write bus LRWBT and LRWBN. Alternatively, data can be written from read/write bus RWBT and RWBN into register arrays (116-j to 116(i+j)) by way of second switches (120-j through 120-(i+j)).

Having described particular accesses to the first embodiment 100, a continuous read operation will now be described. In a continuous read operation, a "miss" can occur in register array section 104. One skilled in the art would recognize that a miss can indicate that the desired data is not "cached" within the register array section 104 and so must be read from memory cell array 102.

A continuous read operation can include activating sense amplifiers 112 to amplify read data from the memory cells 110. If data transfer signal TSW is active, array switches 114 can transfer first read data from memory cells 110 to first transfer bus lines TBT1-1 to TBN1-i. Read/write signal RWi can be activated, and read data can be placed on local bus LRWBT and LRWBN and then to read/write bus RWBT and RWBN.

Further, if first channel select signals are activated at the same time as read/write signals, data on the first transfer bus TBT1-1 to TBN1-i can be stored in register arrays. For example, if first channel select signal CTSWAj is activated synchronously with read/write signal Rwi, first switches 118-j and 118-(i+j) can be turned on, and the read data on transfer bus lines TBT1-i and TBN1-i can be stored in register arrays 116-j to 116-(i+j).

Once read data is stored in a register array, a subsequent access in the continuous read operation can read data from the register arrays. As just one example, read/write signal RWi can be deactivated. If second channel select signal CTSWBj is then activated while a transfer signal YSW1 is activated, a data path can be formed from register array 116-j to read/write bus RWBT and RWBN. Data on read/write bus RWBT and RWBN can then be transferred to local read/write bus LRWBT and LRWBN.

In this way, in a continuous read operation, data can be read from memory cells 110 within a memory cell array 102 but not through a register array section 104. Second and subsequent data reads can then access the register array section 104. Consequently, first accesses that result in a miss to the register array section 104 can be shortened.

Figure 2:
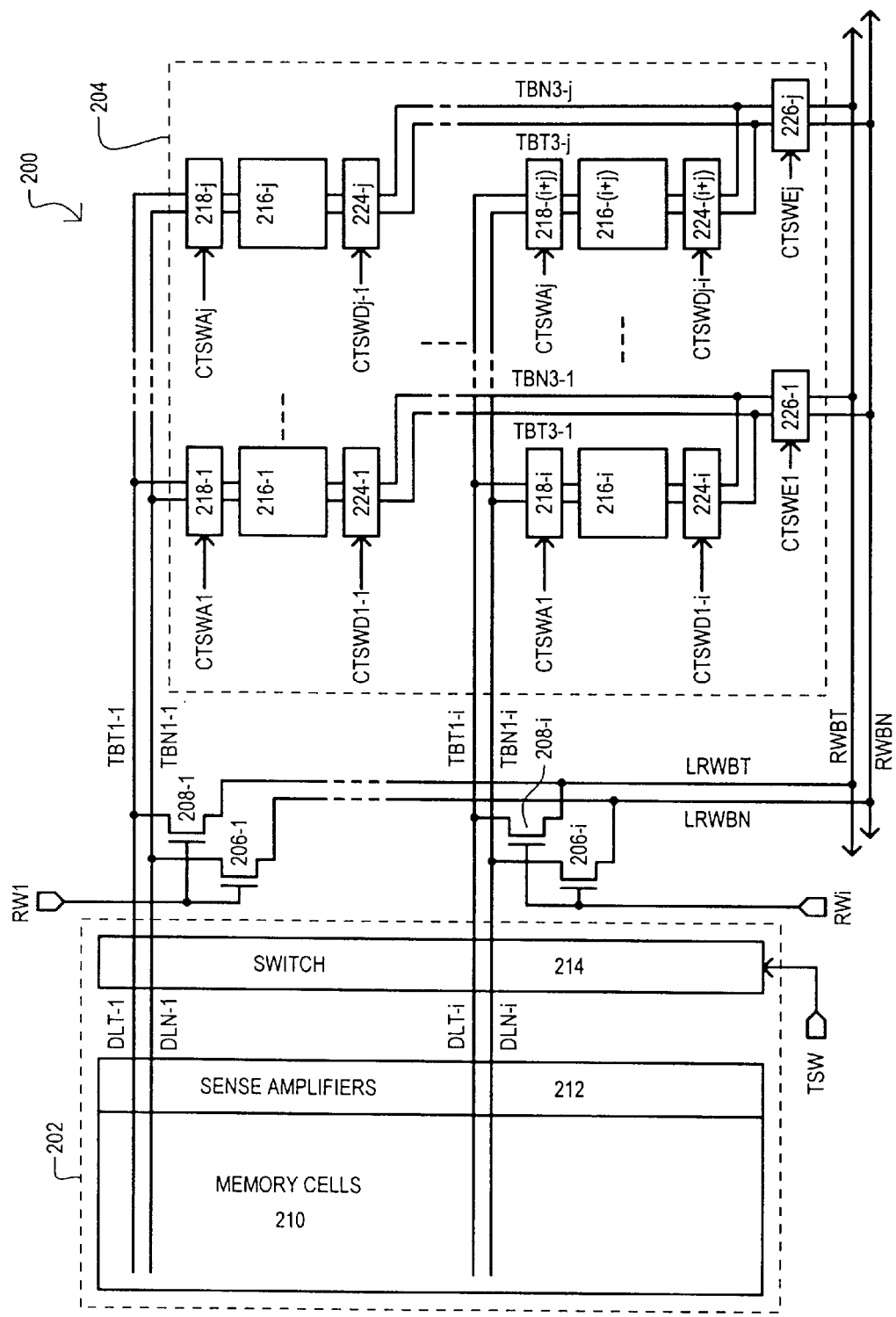
FIG. 2 shows a semiconductor memory according to a second embodiment.
Figure 3:
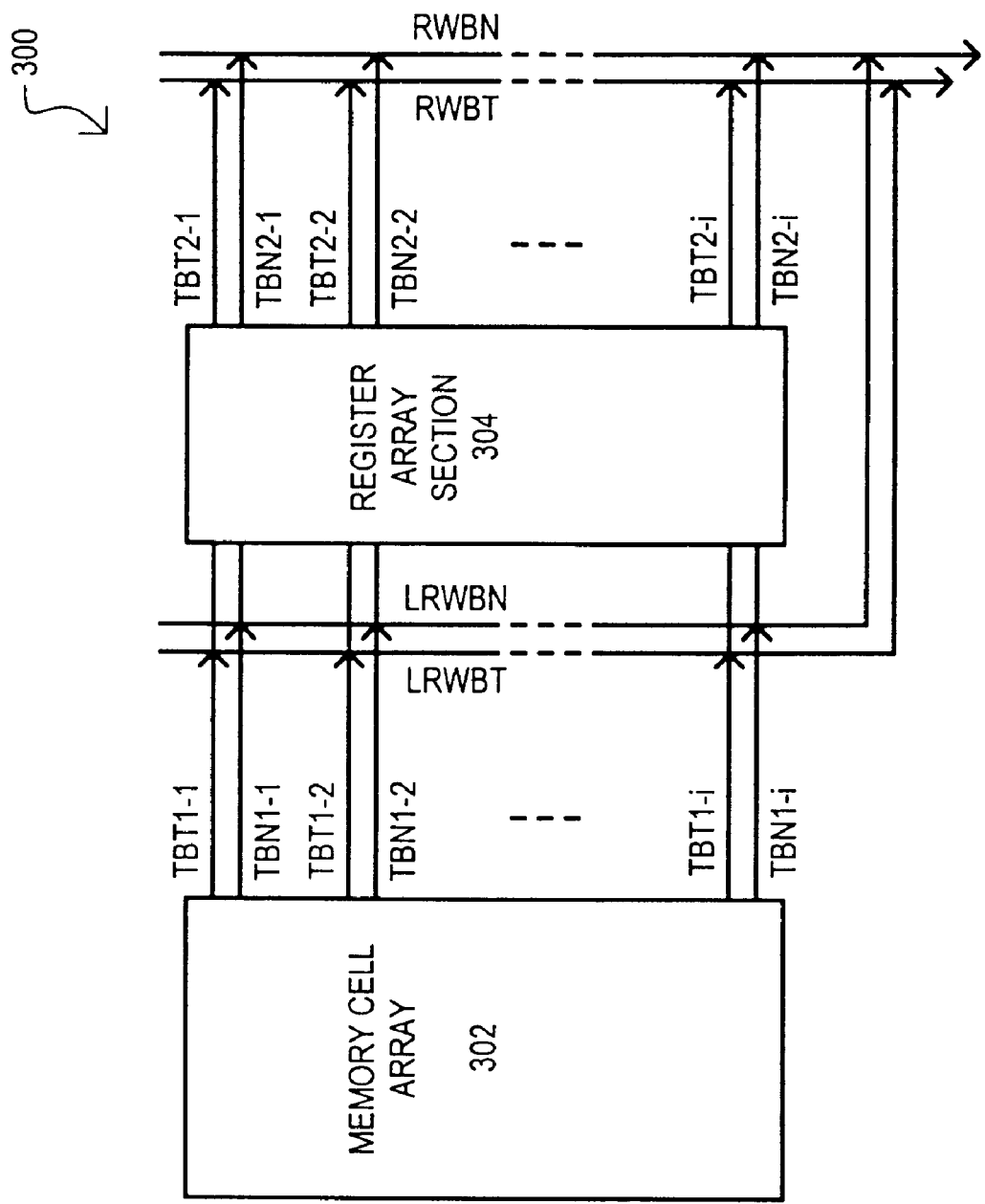
FIG. 3 shows a conventional semiconductor memory.

A second embodiment of the present invention is shown in FIG. 2. The second embodiment is a semiconductor memory designated by the general reference character 200. As shown in FIG. 2, the second embodiment 200 can include many of the same constituents as the first embodiment 100. To that extent, like constituents will be referred to by the same reference character, but with the first number being a "2" instead of a three.

The second embodiment 200 may differ from the first embodiment 100 in the way in which register arrays 216-1 to 216-(i+j) can be connected to read/write bus RWBT and RWBN. In particular, second switches 224-1 to 224-(i+j) can be commonly connected on a row-wise basis to second transfer buses TBT3-1 to TBN3-j. For example, second switches 224-1 to 224-i can be commonly connected to second transfer bus lines TBT3-1 and TBN3-1. Switches of the register array can be activated by a channel selection signal CTSWD1-1 to CTSWDj-i.

Third switches 226-1 to 226-j can be provided between second transfer buses TBT3-1 to TBN3-j and read/write bus RWBT and RWBN. Read/write bus RWBT and RWBN can be connected local read/write bus LRWBT and LRWBN. Third switches 226-1 to 226-j can receive second channel selection signals CTSWE1 to CTSWEj.

In the arrangement of FIG. 2, read data from memory cells 210 can be amplified by sense amplifiers 212. If data transfer signal TSW is active, array switches 214 can transfer data from memory cells 210 to first transfer bus lines TBT1-i and TBN1-i.

If read/write signal RWi is activated, transistors 206-i and 208-i can be turned on, and read data can be placed on local bus LRWBT and LRWBN and also onto read/write bus RWBT and RWBN.

Further, if first channel select signals (CTSWA1 to CTSWAj) are activated at the same time as read/write signals, data on the first transfer bus TBT1-1 and TBN-i can be stored in register arrays (210-1 to 210-(i+j)). For example, if first channel select signal CTSWAj is activated synchronously with read/write signal RWi first switch 218-(i+j) can be turned on, and the read data on transfer bus lines TBT1-1 to TBN1-i can be stored in register arrays 216-j to 216-(i+j).

Once read data is stored in a register array, a subsequent access in the continuous read operation can read data from the register arrays. As just one example, read/write signal RWi can be deactivated. If second channel select signal CTSWDj-1 is then activated while a third channel select signal channel select signal CTSWEj is activated, a data path can be formed from register array 216-j to read/write bus RWBT and RWBN. Data on read/write bus RWBT and RWBN can then propagate to local read/write bus LRWBT and LRWBN.

As shown in the above-described embodiments, a semiconductor memory according to the present invention can include a memory cell array and a register array section that has a cache function. In a continuous read operation, that results in a miss to the cache, data may be read on a read/write bus, but not through the register array section. However, while this data is read, data may also be stored in the register array section. A subsequent read in the continuous read operation may then access the register array. This can make first accesses that result in a register array "miss" faster than a conventional approach.

Further, a semiconductor memory according to the present invention may include a control circuit that transfers first read data from memory cells through a first transfer bus onto a read/write bus. At the same time, data on the first transfer bus may also be stored in register arrays. Thus, according to the embodiments, during a register array miss, a data path can be formed for reading data to a read/write bus and a data path can also be formed for storing data in a register array section. This can shorten first access times.

One skilled the art would recognize the while the first embodiment has been described as including DRAM memory cells in a memory cell array and SRAM memory cells register array section, this should not be construed as limiting the invention thereto. Along these same lines, it is understood that while register arrays may include multiple registers, a register array in the invention may also include a single register.

Further, while n-channel FETs are shown as devices that can transfer data from a first transfer bus to corresponding local read/write bus lines, alternate devices could be used.

The embodiments have described semiconductor memories having memory cells arranged in row and column directions as well as register arrays arranged in row a column direction. One skilled in the art would recognize that the row and column directions of memory cells is not necessarily the same as the row and column directions of register arrays. As just one example, a row of memory cells could be essentially perpendicular to a row of register arrays.

Thus, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory, comprising:
  a memory cell array having a plurality of memory cells arranged into cell rows and cell columns;
  a register array section having a plurality of register arrays arranged into register rows and register columns, the number of register rows and register columns being a predetermined ratio of the number of cell rows and cell columns;
  a first transfer bus coupled between the memory cell array and the register arrays;
  a plurality of first switches coupled between the register arrays and the first transfer bus;
  a plurality of second switches coupled to at least one register array;
  a plurality of third switches coupled between the second switches and a non-local read/write bus; and
  a connection circuit that couples the first transfer bus to a local read/write bus, the local read/write bus being coupled to the non-local read/write bus.

2. The semiconductor memory of claim 1, wherein:
  the connection circuit is turned on in a continuous read operation; and
  a third switch is turned on when the connection circuit is turned off.

3. The semiconductor memory of claim 1, wherein:
  the memory cell array includes a plurality of dynamic random access memory cells.

4. The semiconductor memory of claim 1, wherein:
  the memory cell array includes data lines coupled to the first transfer bus.

5. The semiconductor memory of claim 1, wherein:
  the register arrays include at least one static random access memory cell.

6. The semiconductor memory of claim 1, wherein:
  the connection circuit includes a plurality of transistors having controllable impedance paths disposed between the first transfer bus and the local read/write bus.

7. The semiconductor memory of claim 1, wherein:
  each third switch is commonly coupled to the register arrays of the same register column.

8. The semiconductor memory of claim 1, wherein:
  each third switch is commonly coupled to the register arrays of the same register row.

9. A semiconductor memory, comprising:
  a memory cell array including a plurality of memory cells arranged into rows and columns;
  a register array section having a plurality of register arrays arranged into rows and columns, the number of register array rows and columns being a predetermined ratio of the number memory cell array rows and columns;
  a transfer bus coupled between the memory cell array and the register array section;
  a plurality of first switches coupled between the register arrays and the transfer bus;
  a plurality of second switches coupled to the register arrays;
  a plurality of third switches, each third switch being commonly coupled between the second switches of the same register array column and a read/write bus;
  a connection circuit that connects the transfer bus to a local read/write bus that is coupled to the read/write bus.

10. The semiconductor memory of claim 9, wherein:
  the connection circuit is turned on in a continuous read operation; and
  a third switch is turned on when the connection circuit is turned off.

11. The semiconductor memory of claim 10, wherein:
  the connection circuit is turned on to transfer data from the first transfer bus to the read/write bus and at least one first switch is turned on to transfer data from the first transfer bus to the register arrays; and
  at least one second switch can be subsequently turned on to transfer data from at least one register array to the read/write bus.

12. The semiconductor memory of claim 9, wherein:
  the connection circuit includes a plurality of transistors having controllable impedance paths coupled between the transfer bus and the read/write bus.

13. The semiconductor memory of claim 12, wherein:
  the connection circuit includes transistors pairs coupled between transfer bus line pairs and at least one read/write bus line pair.

14. A semiconductor memory, comprising:
  a memory cell array having a plurality of memory cells arranged into a predetermined number of rows and columns;
  at least one register array having a plurality of registers arranged into rows and columns, the number of registers in the rows and columns being a predetermined ratio of the number of memory cells in the rows and columns in the memory cell array;
  a first transfer bus coupled between the memory cell array and the at least one register array;
  a second transfer bus coupled between the at least one register array and a non-local read/write bus;
  a local read/write bus coupled between the first transfer bus and the non-local read/write bus; and
  a control circuit that transfers first read data from the memory cell array to the non-local read/write bus through the first transfer bus and the local read/write bus, and at essentially the same time, transfers second read data to the at least one register array through the first transfer bus.

15. The semiconductor memory of claim 14, wherein:
  the control circuit can read second read data from the register array section after reading first read data from the memory cell array.

16. The semiconductor memory of claim 15, wherein:
  the control circuit includes a connection circuit coupled between the first transfer bus and the local read/write bus and first switches coupled between the first transfer bus and the at least one register array.

17. The semiconductor memory of claim 16, wherein:
the connection circuit and the first switches are enabled when first data is read from the memory cell array and the connection circuit is disabled when second data is read from the at least one register array.

18. The semiconductor memory of claim 17, wherein:
the control circuit further includes second switches coupled between the at least one register array and the read/write bus, the second switches being enabled when second data is read from the at least one register array.

19. The semiconductor memory of claim 14, wherein:
the rows of registers in the at least one register array are commonly coupled to the second transfer bus; and
the control circuit includes a plurality of second switches coupled between the second transfer bus and the read/write bus.

20. The semiconductor memory of claim 14, wherein:
the columns of registers in the at least one register array are commonly coupled to the second transfer bus; and
the control circuit includes a plurality of second switches coupled between the second transfer bus and the read/write bus.

* * * * *